United States Patent
Park

(10) Patent No.: US 7,622,337 B2
(45) Date of Patent: Nov. 24, 2009

(54) METHOD FOR FABRICATING A TRANSISTOR USING A SOI WAFER

(75) Inventor: Jeong Ho Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 280 days.

(21) Appl. No.: 11/615,796

(22) Filed: Dec. 22, 2006

(65) Prior Publication Data

US 2007/0152272 A1 Jul. 5, 2007

(30) Foreign Application Priority Data

Dec. 29, 2005 (KR) .................. 10-2005-0133430

(51) Int. Cl.
*H01L 21/00* (2006.01)
*H01L 21/84* (2006.01)

(52) U.S. Cl. .............. 438/164; 438/283; 438/595; 257/E21.561

(58) Field of Classification Search ........... 438/151, 438/157, 164, 221, 229–230, 283, 299, 300, 438/479, 595, 700, 149, 218, 219, 294–296, 438/304, 404, 424, 585, 592, 596, 660, 664, 438/682, 683; 257/347, 352–354, E21.167, 257/E21.32, E21.545, E21.546, E21.561, 257/E21.606, E21.619, E21.621, E21.622, 257/E21.626, E21.628, E21.634–E21.636, 257/E21.64, E21.642, 349

See application file for complete search history.

(56) References Cited

U.S. PATENT DOCUMENTS

| | | | | |
|---|---|---|---|---|
| 5,773,331 | A * | 6/1998 | Solomon et al. | 438/164 |
| 6,930,359 | B2 * | 8/2005 | Ushiku | 257/347 |
| 7,005,302 | B2 * | 2/2006 | Xiang | 438/3 |
| 7,205,185 | B2 * | 4/2007 | Dokumaci et al. | 438/197 |
| 7,247,910 | B2 * | 7/2007 | Lee et al. | 257/347 |
| 7,265,031 | B2 * | 9/2007 | Oh et al. | 438/459 |
| 7,265,424 | B2 * | 9/2007 | Hofmann et al. | 257/368 |
| 2004/0209438 | A1 | 10/2004 | Saito et al. | |
| 2005/0067659 | A1 * | 3/2005 | Gutsche et al. | 257/390 |
| 2006/0138542 | A1 * | 6/2006 | Xiang | 257/347 |
| 2008/0035997 | A1 * | 2/2008 | Hofmann et al. | 257/347 |

OTHER PUBLICATIONS

Ginsberg, B.J., "Selective epitaxial growth of silicon and some potential applications", IBM Journal of Research and Development, Vol. 34, No. 6, p. 816, Nov. 1990.*
Wong, S.S. et al "Elevated source/drain Mosfet", Dec. 1984, IEDM Tech. Dig., p. 634.*

* cited by examiner

*Primary Examiner*—Matthew C Landau
*Assistant Examiner*—Joseph C Nicely
(74) *Attorney, Agent, or Firm*—Sherr & Vaughn, PLLC

(57) ABSTRACT

Embodiments relate to a method for fabricating a transistor by using a SOI wafer. A gate insulation layer and a first gate conductive layer on a silicon-on-insulator substrate of a substrate to form a first gate conductive pattern, a gate insulation layer pattern, and a silicon layer pattern. A device isolation insulation layer exposing the top surface of the first gate conductive layer pattern may be formed. A second gate conductive layer may be formed. A mask pattern may be formed. Then, a gate may be formed by etching. After forming a source and drain conductive layer on the silicon layer pattern, the mask pattern may be removed. A salicide layer may be selectively contacting the gate and the source and drain conductive layer may be formed.

13 Claims, 4 Drawing Sheets

METHOD FOR FABRICATING A TRANSISTOR USING A SOI WAFER

The present application claims priority under 35 U.S.C. 119 and 35 U.S.C. 365 to Korean Patent Application No. 10-2005-0133430 (filed on Dec. 29, 2005), which is hereby incorporated by reference in its entirety.

BACKGROUND

In a related art method of manufacturing transistors, a device isolation oxide layer and a source/drain region may be disposed in a silicon Si substrate, and may form a transistor structure. Accordingly, since the source/drain region may be disposed below the silicon substrate, it may be difficult to reduce a source/drain resistance.

Moreover, since a device isolation oxide layer may be formed by a shallow trench isolation (STI) process, transistor device characteristics may degrade due to an influence of stress caused by the STI process. In addition, a divot phenomenon, e.g., an abnormal hump phenomenon that may be caused by a wrap around phenomenon of a wafer, may occur and it may be difficult to control a leakage current caused by a STI edge.

A transistor device that may reduce a source/drain resistance and a leakage current to obtain device reliability may be beneficial.

SUMMARY

Embodiments relate to a semiconductor device. Embodiments relate to more particularly, to a method for fabricating a transistor by using a SOI wafer.

In embodiments, a method for fabricating a transistor of a semiconductor device may reduce a source/drain resistance and a leakage current and may obtain device reliability.

According to embodiments, a source/drain region may be formed on a silicon substrate. Performance may be improved by reducing a source/drain resistance, and cost of stress due to shallow trench isolation (STI) may be reduced. Moreover, device reliability may be achieved, and a leakage current by a STI edge during an STI process may be reduced by preventing a divot phenomenon caused by a related art STI process.

According to embodiments, a method for fabricating a transistor by using a silicon-on-insulator wafer may include forming a gate insulation layer and a first gate conductive layer on a silicon-on-insulator substrate of a substrate, a middle insulation layer, and a silicon layer, may be selectively etching the first gate conductive layer, the gate insulation layer, and the silicon layer to form a first gate conductive pattern, a gate insulation layer pattern, and a silicon layer pattern, forming a device isolation insulation layer exposing the top surface of the first gate conductive layer pattern, forming a second gate conductive layer on the first gate conductive layer pattern, forming a mask pattern on the second gate conductive layer, etching the second gate conductive layer, the first gate conductive layer pattern, and the gate insulation layer pattern exposed by the mask pattern to form a gate may be patterned from the second gate conductive layer and the first gate conductive layer pattern, forming a spacer on a sidewall of the gate, the spacer exposing the silicon layer pattern, forming a source and drain conductive layer on the exposed silicon layer pattern, removing the mask pattern to expose the gate, and forming a salicide layer may be selectively contacting the gate and the source and drain conductive layer.

According to embodiments, the formation of the device isolation insulation layer may include forming an insulation layer covering the first gate conductive layer pattern in a thickness of 2000 to 5000 Å, and performing chemical mechanical polishing on the insulation layer to expose the top surface of the first gate conductive layer pattern.

According to embodiments, the etching for the gate may use the gate insulation layer pattern as an etching stop layer.

According to embodiments, the formation of the source and drain conductive layer may include depositing a conductive layer covering the mask pattern, performing chemical mechanical polishing on the conductive layer by using the mask pattern as a polishing stop layer, and etching the conductive layer for recess to expose the top surface of the device isolation insulation layer.

According to embodiments, the gate and the source and drain conductive layer may be may be formed of a polysilicon layer. The salicide layer may be may be formed of one of Ti-based salicide, Co-based salicide, Ta-based salicide, and Ni-based salicide.

According to embodiments, a method for fabricating a transistor device may be capable of reducing a source/drain resistance and a leakage current and may obtain device reliability.

DETAILED DESCRIPTION OF THE INVENTION

Figure 1:
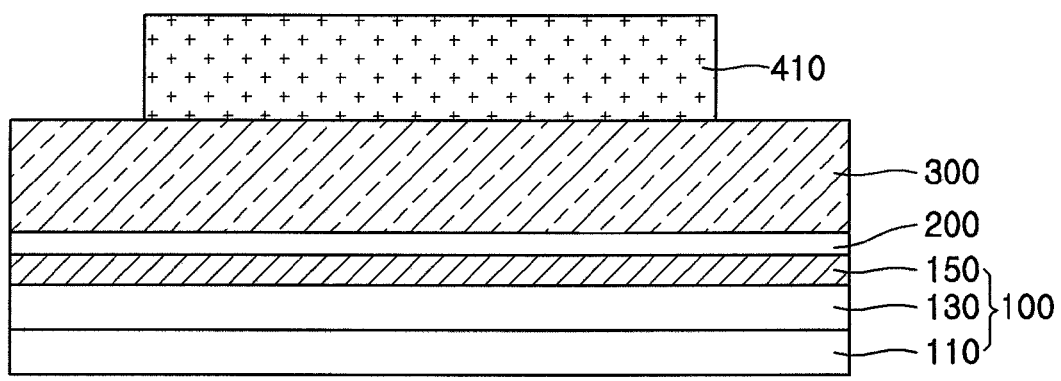
FIGS. 1 through 8 are example diagrams illustrating a semiconductor and a method for fabricating a transistor according to embodiments.

Referring to FIG. 1, gate insulation layer 200 and first gate conductive layer 300 may be sequentially formed on SOI substrate 100. First mask pattern 410 may then be formed. SOI substrate 100 may include middle insulation layer 130 and silicon layer 150 on substrate 110.

Figure 2:
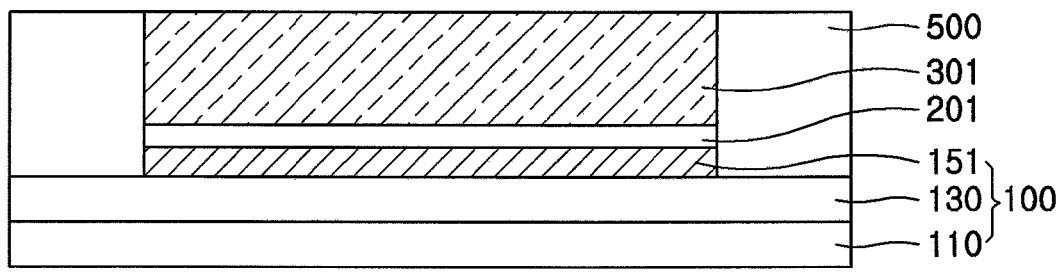

Referring to FIG. 2, first gate conductive layer 300, gate insulation layer 200, and silicon layer 150 of SOI substrate 100 may be etched, for example by a dry etching method, using first mask pattern 410. First gate conductive layer pattern 301, gate insulation layer pattern 201, and silicon layer pattern 151 may accordingly be formed. First mask pattern 410 may be removed, and a first insulation layer may be deposited. The first insulation layer may have a thickness of approximately 2000 to 5000 Å. Device isolation insulation layer 500 may be formed, for example by using a chemical mechanical polishing (CMP) method.

In embodiments, when device isolation insulation layer 500 is formed using a CMP method, first gate conductive layer pattern 301 may be used as a CMP stop layer.

Figure 3:
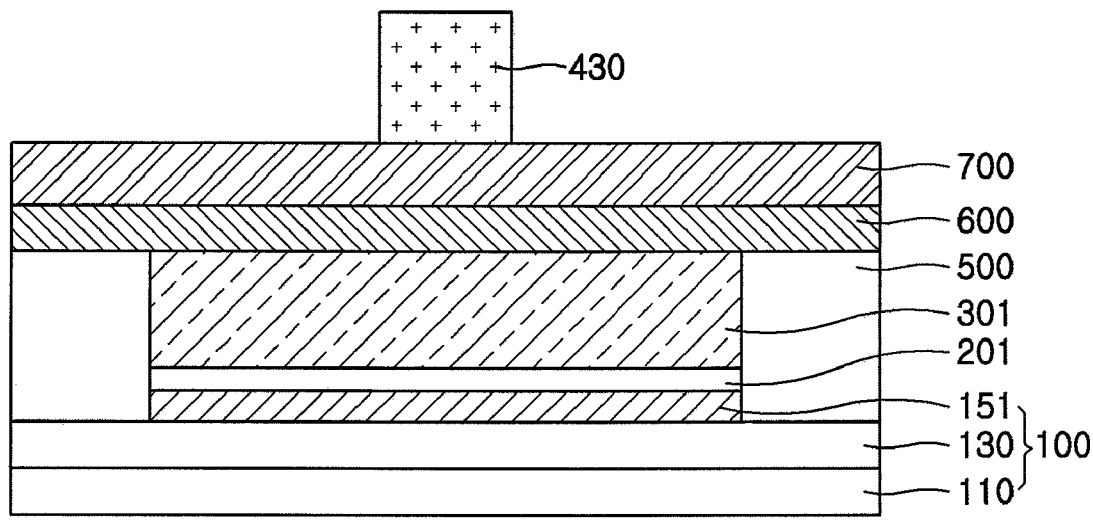

Referring to FIG. 3, second gate conductive layer 600 and second mask insulation layer 700 may be sequentially deposited, and then third mask pattern 430 may be formed.

Figure 4:
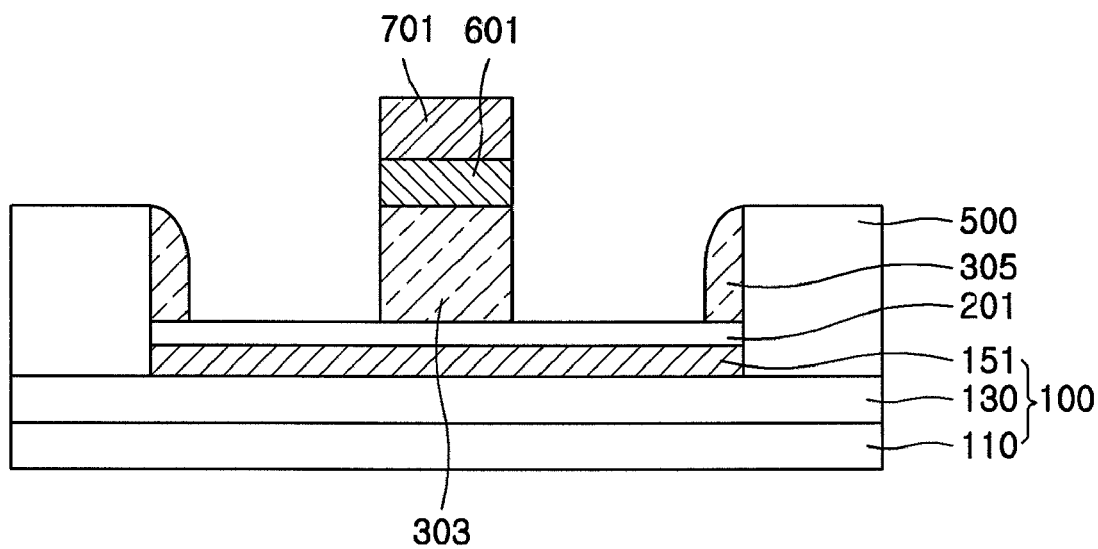

Referring to FIG. 4, second mask pattern 701 may be formed as a hard mask of silicon nitride, for example by a dry etching method using third mask pattern 430. Second gate pattern 601 and gate pattern 303 may be formed, for example by a dry etching process using second mask pattern 701. Third mask pattern 430 may then be removed.

In embodiments, when etching is performed by a dry etching method, gate insulation layer pattern 201 may be used as an etch stop layer. In embodiments, a remaining part of first gate conductive layer pattern 301 may remain on a sidewall of device isolation insulation layer 500 in a spacer form 305.

Figure 5:
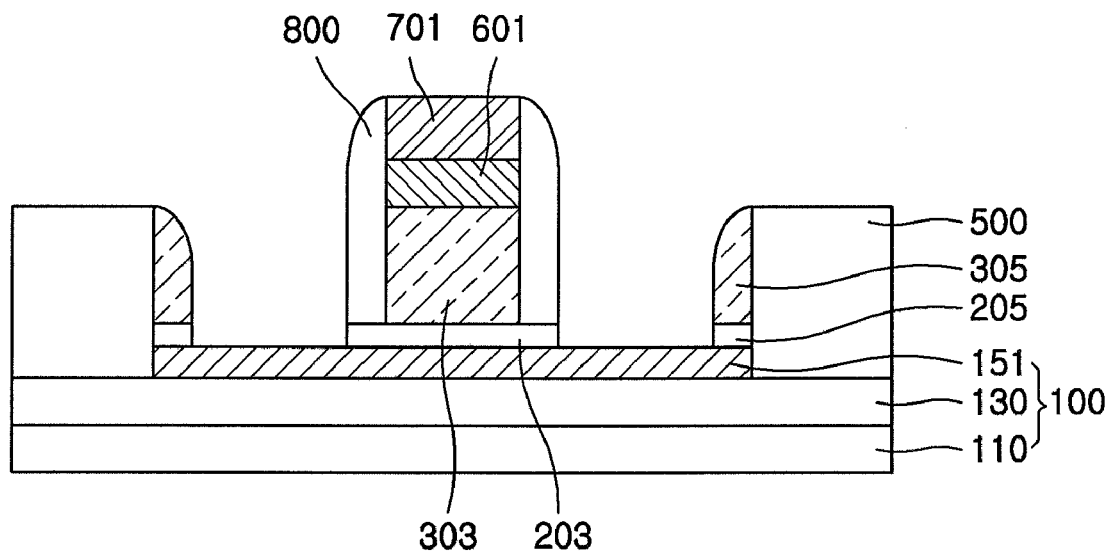

Referring to FIG. 5, a spacer layer of a silicon nitride insulation layer may be deposited. Spacer 800 and gate insulation pattern 203 may be formed, for example by using an etch back method.

Figure 6:
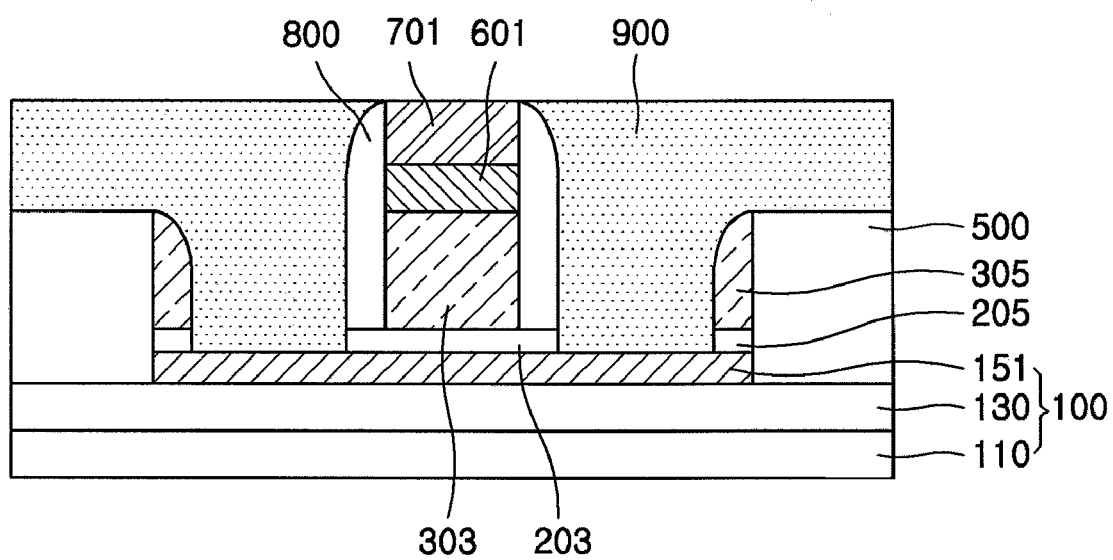

Referring to FIG. 6, a source/drain conductor may be deposited and planarized, for example by using a CMP method to form source/drain conductive layer 900. In embodiments, when source/drain conductive layer 900 is formed by using a CMP method, second mask pattern 701 may be used as a CMP stop layer.

Figure 7:
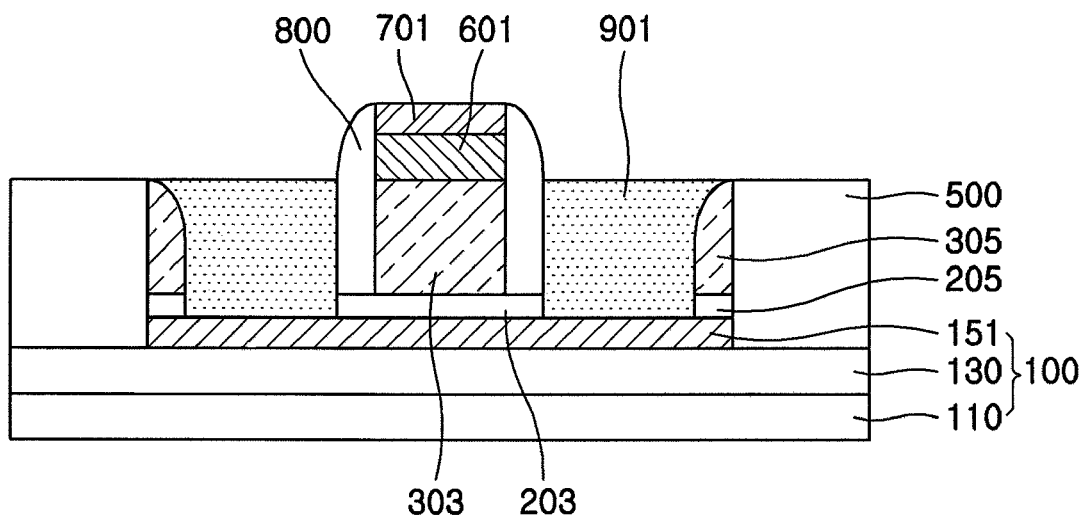

Referring to FIG. 7, the source/drain conductive layer 900 may be recessed, for example by using an etch back method to form recessed source/drain conductive layer 901 and to expose side of the spacer 800.

Figure 8:
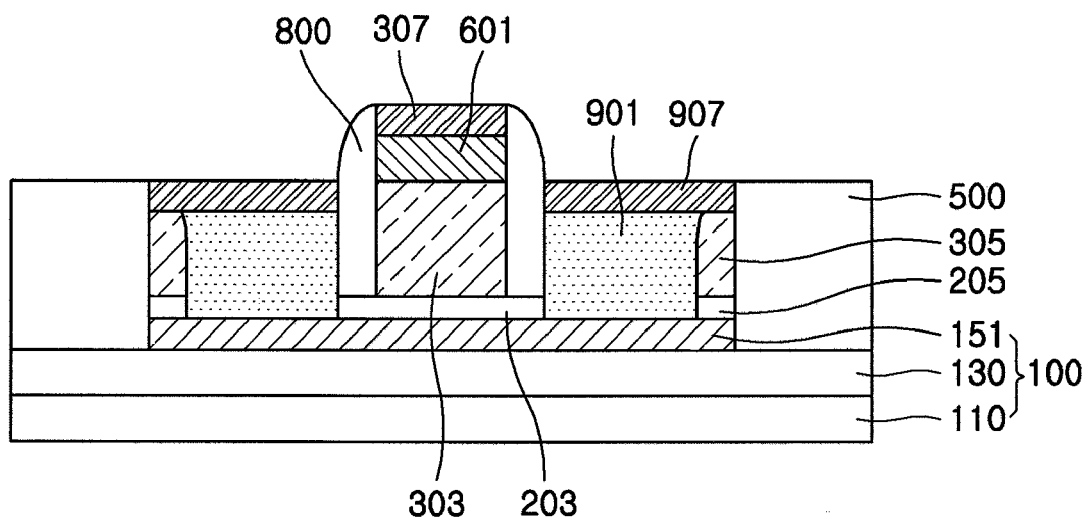

Referring to FIG. 8, after removing second mask pattern 701, for example by wet etching, salicide may be formed on exposed source/drain conductive layer 901 and second gate pattern 601. First salicide layer 307 may thus be formed on second gate pattern 601, and second salicide layer 907 may thus be formed on source/drain conductor 901.

A layer for the first and second gates, and source and drain conductive layers may be may be formed including an identical conductive layer, e.g., a polysilicon layer.

Additionally, salicide layers 307 and 907 may be formed including one of Ti-based salicide, Co-based salicide, Ta-based salicide, and Ni-based salicide.

According to embodiments, it may be possible to reduce resistance in a source/drain region. Additionally, stress due to a STI process may be minimized. Moreover, device reliability may be improved by preventing a divot phenomenon caused by a related art STI process. A leakage current by a STI edge during a related art STI process may be minimized.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method comprising:
    forming a first gate conductive layer pattern, a gate insulation layer pattern, and a silicon layer pattern over an SOI substrate comprising a substrate layer, a middle insulation layer formed over the substrate layer and a silicon layer formed over the middle insulation layer, wherein the silicon layer pattern is formed by etching the silicon layer;
    forming device isolation insulation layers over and contacting the middle insulation layer;
    forming a gate by forming a second gate conductive layer over the first gate conductive layer pattern and then etching the first gate conductive layer pattern and the second gate conductive layer to also form first gate conductive layer spacers on and contacting the gate insulating layer pattern and a sidewall of the device isolation insulation layers;
    forming insulating layer spacers spaced apart from a respective first gate conductive layer spacer and on and contacting sidewalls of the gate;
    forming a source and drain conductive layer adjacent to and contacting the first gate conductive layer spacers and the insulating layer spacers and over and contacting an exposed portion of the SOI substrate;
    forming a salicide layer over each of the gate and the source and drain conductive layer.

2. The method of claim 1, wherein forming the first gate conductive layer pattern, the gate insulation layer pattern and the silicon layer pattern comprises:
    forming a gate insulation layer and a first gate conductive layer over the SOI substrate, wherein the gate insulation layer is formed over the silicon layer;
    selectively etching the first gate conductive layer, the gate insulation layer, and the silicon layer to form the first gate conductive layer pattern, the gate insulation layer pattern, and the silicon layer pattern.

3. The method of claim 2, wherein the exposed portion of the SOI substrate comprises the silicon layer pattern, which is exposed when forming the spacers.

4. The method of claim 1, wherein forming the device isolation insulation layer comprises:
    forming an insulation layer covering the first gate conductive layer pattern, the insulation layer having a thickness of 2000 to 5000 Å; and
    performing chemical mechanical polishing on the insulation layer to expose the top surface of the first gate conductive layer pattern.

5. The method of claim 1, wherein etching the first gate conductive layer pattern and the second gate conductive layer comprises forming a mask pattern over and contacting the second gate conductive layer and then etching the second gate conductive layer and the first gate conductive layer pattern.

6. The method of claim 5, wherein forming the source and drain conductive layer comprises:
    depositing a conductive layer covering the mask pattern;
    performing chemical mechanical polishing on the conductive layer using the mask pattern as a polishing stop layer; and
    etching the conductive layer to recess the source and drain conductive layer and to expose the top surface of the device isolation insulation layer and a top portion of the spacers.

7. The method of claim 6, further comprising removing the mask pattern to expose the gate.

8. The method of claim 1, wherein the gate insulation layer pattern comprises an etch stop layer for etching the gate.

9. The method of claim 1, wherein the gate and the source and drain conductive layer each comprise a polysilicon layer.

10. The method of claim 1, wherein the salicide layer comprises at least one of Ti-based salicide, Co-based salicide, Ta-based salicide, and Ni-based salicide.

11. A method comprising:
    providing a SOI substrate comprising a substrate layer, an insulation layer formed over and contacting the substrate layer, and a silicon layer formed over and contacting the insulation layer;
    forming a silicon layer pattern by etching the silicon layer, a first gate insulating layer pattern over and contacting the silicon layer pattern, a first gate conductive layer pattern over and contacting the first gate insulating layer pattern, and a second gate conductive layer pattern over and contacting the first gate conductive layer pattern, a device isolation insulation layer spaced apart from the first and second gate conductive layer patterns and over and contacting the insulation layer of the SOI substrate and a sidewall of the silicon layer pattern, and a first gate conductive layer pattern spacer over and contacting a sidewall of the device isolation insulation layer;

forming an insulating layer spacer over and contacting the uppermost surface of the first gate insulating layer pattern and a sidewall of the first and second gate conductive layer patterns;

forming a source and drain conductive layer between the device isolation insulation layer and the first and second gate conductive layer patterns and over and contacting the uppermost surface of the silicon layer pattern and a respective sidewall of the insulating layer spacer, the first gate insulating layer pattern and the first gate conductive layer pattern spacer.

12. The method of claim 11, wherein the uppermost surface of the source and drain conductive layer and the insulating layer spacer are coplanar.

13. The method of claim 11, wherein the uppermost surface of the source and drain conductive layer is formed spatially above the uppermost surface of the first gate insulating layer pattern.

* * * * *